(12) United States Patent
Tsutsumi et al.

(10) Patent No.: US 6,361,879 B1
(45) Date of Patent: Mar. 26, 2002

(54) SEMICONDUCTOR DEVICE AND METHOD FOR FABRICATING IT, AND SEMICONDUCTOR SEALING RESIN COMPOSITION

(75) Inventors: Yasuaki Tsutsumi, Inazawa; Masayuki Tanaka, Nagoya; Toshimi Kawahara; Yukio Takigawa, both of Kawasaki, all of (JP)

(73) Assignees: Toray Industries, Inc. (JP); Fujitsu Limited (JP)

( * ) Notice: Subject to any disclaimer, the term of this patent is extended or adjusted under 35 U.S.C. 154(b) by 0 days.

(21) Appl. No.: 09/381,765

(22) PCT Filed: Feb. 8, 1999

(86) PCT No.: PCT/JP99/00539

§ 371 Date: Sep. 23, 1999

§ 102(e) Date: Sep. 23, 1999

(87) PCT Pub. No.: WO99/40626

PCT Pub. Date: Aug. 12, 1999

(30) Foreign Application Priority Data

Feb. 9, 1998 (JP) .............................................. 10-42889

(51) Int. Cl.⁷ .............................................. H01L 29/12
(52) U.S. Cl. ........................ 428/620; 257/791; 257/792; 257/793; 523/427; 523/428; 523/443; 525/481; 525/524; 525/525; 525/526; 528/106

(58) Field of Search .......................... 428/620; 438/112, 438/113, 114; 523/427, 428, 440, 443, 466; 525/481, 523, 524, 525, 526; 528/87, 106; 257/791, 792, 793

(56) References Cited

U.S. PATENT DOCUMENTS 5,298,548 A * 3/1994 Shiobara et al. ............ 523/443
5,731,370 A * 3/1998 Shiobara et al. ............ 523/466

* cited by examiner

*Primary Examiner*—Robert Dawson
*Assistant Examiner*—D. Aylward
(74) *Attorney, Agent, or Firm*—Schnader Harrison; Segal & Lewis LLP (57) ABSTRACT

A sealed semiconductor chip having a surface film of a sealed resin composition, wherein the resin composition has a linear expansion coefficient of $60 \times 10^{-6}/K$ or less at a temperature equal to or less than its glass transition point and $140 \times 10^{-6}/K$ or less at a temperature equal to or higher than its glass transition point; a semiconductor-sealing resin composition for sealing a semiconductor chip, which has a linear expansion coefficient of $60 \times 10^{-6}/K$ or less at a temperature equal to or less than its glass transition point and $140 \times 10^{-6}/K$ or less at a temperature equal to or higher than its glass transition point; the sealed semiconductor chip is chip size and has high reliability; the semiconductor-sealing resin composition creates a good seal on chip wafers and has high reliability; and the chip wafers sealed with a surface film of the resin composition warp little.

32 Claims, 1 Drawing Sheet

SEMICONDUCTOR DEVICE AND METHOD FOR FABRICATING IT, AND SEMICONDUCTOR SEALING RESIN COMPOSITION

TECHNICAL FIELD

The present invention relates to a sealed semiconductor chip having a surface film comprising a sealed resin composition and also relates to a semiconductor-sealing resin composition sealing the semiconductor chip. Further the invention relates to a sealed semiconductor chip fabricated by sealing semiconductor chips in wafers followed by cutting the wafers.

BACKGROUND OF THE INVENTION

With the recent tendency toward downsized portable appliances, parts of semiconductor devices for those appliances are being much downsized and thinned and their quality is being much improved. A conventional semiconductor device comprises semiconductor chips and a lead frame, in which the chips except outer electrodes (pins) that are necessary for mounting the chips on a printed circuit board are sealed with a resin on their both surfaces. Therefore, developing a new method of packaging lead frames and semiconductor chips has heretofore been essentially targeted for downsized semiconductor devices. For thinned semiconductor devices, the thickness of the sealing resin is being reduced.

Through those technical developments, the volume of the sealing resin for semiconductor devices has been reduced, and thinned TSOPs (thin small outline packages) and multi-pinned QFPs (quad flat packages) have come on the market.

On the other hand, for chip-size semiconductor devices, some proposals have been made for flip chip bonding with under filler injection or for resin reinforcement of outer electrodes of bumps at their root.

However, the flip chip bonding requires high-level packaging techniques of package makers and, in addition, increases the packaging costs. The resin reinforcement at the root of bumps lowers the reliability of semiconductor devices, though not so much increasing the packaging costs.

One goal of the present invention is to provide a highlyreliable, chip-size semiconductor chip at low cost.

On the other hand, a method of sealing semiconductor chips in wafers is problematic in that creating a good seal with no defect of conventional sealing resins on the entire surface of wafers is difficult, wafers are often warped when entirely sealed with conventional resins, and the reliability of semiconductor devices, including temperature cycle resistance and moisture resistance thereof, is poor.

Another goal of the invention is to provide a highlyreliable, semiconductor-sealing resin composition capable of creating a good seal on wafers with little warping of the wafers in a method of fabricating semiconductor chips sealed with the resin composition in wafers.

DISCLOSURE OF THE INVENTION

The invention is a sealed semiconductor chip comprising a semiconductor chip having a surface film comprising a sealed resin composition, wherein the resin composition has a linear expansion coefficient of $60 \times 10^{-6}$/K or less at a temperature equal to or lower than its glass transition point and $140 \times 10^{-6}$/K or less at a temperature equal to or higher than its glass transition point.

The invention is also a semiconductor-sealing resin composition for sealing a semiconductor chip having a surface film comprising a sealed resin composition, wherein the resin composition has a linear expansion coefficient of $60 \times 10^{-6}$/K or less at a temperature equal to or less than its glass transition point and $140 \times 10^{-6}$/K or less at a temperature equal to or higher than its glass transition point.

BEST MODES FOR CARRYING OUT THE INVENTION

The semiconductor chip of the invention comprises a semiconductor chip having a surface film comprising a sealed resin composition. It is fabricated by sealing semiconductor chips in a wafer with the resin composition of the invention to thereby form a thin resin composition seal on the entire surface of the wafer of the chips, as in FIG. 1 and FIG. 2, and thereafter cutting the resin-sealed wafers into individual semiconductor chips. The semiconductor chips in a wafer may have outer electrodes formed thereon. According to the method, efficiently and inexpensively formed are IC packages (chip-size packages, CSPs) that are equal in size to IC chips (semiconductor chips). The size of the wafer to be used in the semiconductor chip fabrication is not specifically defined, and herein employable are any ordinary wafers of all sizes for semiconductor chips, including, for example, 6-inch wafers, 8-inch wafers, 12-inch wafers, etc. The thickness of the resin composition to be sealed to the semiconductor chips also is not specifically defined, but, in general, it falls between 30 and 2000 μm thick, preferably between 30 and 300 μm thick, more preferably between 30 and 150 μm thick.

The resin composition for the sealed semiconductor chip of the invention has a linear expansion coefficient of $60 \times 10^{-6}$/K or less at a temperature equal to or less than its glass transition point and $140 \times 10^{-6}$/K or less at a temperature equal to or higher than its glass transition point. If the linear expansion coefficient of the resin composition in the indicated condition oversteps the defined range, chip wafers sealed with the resin composition will be warped and could not be cut conveniently into individual chips. In addition, the reliability of the sealed semiconductor, chip including the temperature cycle resistance thereof, will be unfavorably lowered.

In order to further reduce the warpage of chip wafers sealed with the resin composition and to further improve the reliability such as the temperature cycle resistance of the sealed semiconductor chip, it is desirable that the resin composition has a flexural modulus of 1 GPa to 30 GPa at 23° C.

More desirably, the resin composition satisfies the equation: $5 \times 10^{-5}$ Gpa/K $\leq$ (linear expansion coefficient at a temperature not higher than the glass transition point)$\times$(flexural modulus at 23° C.)$\leq 30 \times 10^{-5}$ Gpa/K.

The resin composition of the invention is not specifically defined, so far as it satisfies the characteristics noted above. For this, for example, employable are various thermoplastic resins and various thermosetting resins. In view of their reliability, especially preferred are thermosetting resins. For example, employable herein are epoxy resin compositions, polyimide resin compositions, silicone resin compositions, etc. Of those, especially preferred are epoxy resin compositions.

The epoxy resin composition for use in the invention generally comprises (A) an epoxy resin, (B) a curing agent, and (C) a filler. Regarding the formulation of the composition, the amount of the epoxy resin (A) maybe 0.5 to 80% by weight, but preferably 1 to 50% by weight, more preferably 2 to 30% by weight, that of the curing agent (B) may be 0.5 to 80% by weight, but preferably 1 to 50% by weight, more preferably 2 to 30% by weight, and that of the filler (C) may be 35 to 98% by weight, but preferably 40 to 95% by weight, more preferably 45 to 95% by weight. If the component amounts overstep the defined ranges, the resin composition could not create a good seal on chip wafers, chip wafers sealed with the resin composition will be warped, or the reliability of the semiconductor chip sealed with the resin composition will be poor. For these reasons, overstepping the defined ranges is unfavorable.

The epoxy resin (A) that may be included in the resin composition of the invention is not specifically defined, so far as it has at least two epoxy groups in one molecule. Examples of the epoxy resin (A) include bisphenol-type epoxy resins, bisphenol F-type epoxy resins, cresol-novolak-type epoxy resins, phenol-novolak-type epoxy resins, biphenyl-type epoxy resins, naphthalene-type epoxy resins, alicyclic epoxy resins, linear aliphatic epoxy resins, novolak-type epoxy resins, polyfunctional epoxy resins to be produced from polyfunctional phenols, dicyclopentadiene-type epoxy resins, halogenoepoxy resins, etc. Of those, preferred are biphenyl-type epoxy resins such as 4,4'-bis (2,6-epoxypropoxy)-3,3',5,5'-tetramethylbiphenyl, 4,4'-bis(2,6-epoxypropoxy) methylbiphenyl, etc., as well as cresol-novolak-type epoxy resins, naphthalene-type epoxy resins, dicyclopentadiene-type epoxy resins, and polyfunctional epoxy resins from polyfunctional phenols such as trishydroxyphenylmethane-type or tetraphenololethane-type ones, in view of their reliability and seal-forming ability.

The curing agent (B) that may be in the resin composition of the invention is not also specifically defined, so far as it reacts with and cures the epoxy resin (A). Its specific examples include phenol-novolak resins, cresol-novolak resins, phenol-aralkyl resins, terpene skeleton-having phenolic resins, trishydroxyphenylmethane, novolak resins and resol resins to be produced from bisphenol A and resorcinol, polyphenol compounds such as polyvinylphenol, etc., acid anhydrides such as hexahydrophthalic anhydride, methyl-hexahydrophthalic anhydride, methylnadic anhydride, maleic anhydride, etc., and also aromatic compounds such as metaphenylenediamine, diaminodiphenylmethane, diaminophene sulfone, etc. Of those, especially preferred are phenolic resins having at least two phenolic hydroxyl groups in the molecule in view of their reliability and seal-forming ability. For example, they include phenol-novolak resins, phenol-aralkyl resins, terpene skeleton-having phenols, trishydroxyphenylmethane, etc. Two or more of those curing agents (B) may be used in combination. Preferred combinations are a terpene-phenolic resin with a phenol-aralkyl resin and a terpene-phenolic resin with a polyfunctional phenolic resin.

Examples of the filler (C) that may be included in the resin composition of the invention include amorphous silica, crystalline silica, calcium carbonate, magnesium carbonate, alumina, magnesia, clay, talc, calcium silicate, titanium oxide, antimony oxide, asbestos, glass fibers, etc. Of those, amorphous silica is preferred, as it greatly lowers the linear expansion coefficient of the composition and is effective for improving the reliability of the composition. Examples of amorphous silica include fused silica as prepared by fusing quartz and synthetic silica as prepared in various methods. They may be ground ones or spherical ones.

The resin composition of the invention may contain an elastomer (D), which is effective for reducing the warpage of semiconductor chips and for improving the temperature cycle resistance thereof. Examples of the elastomer include olefinic copolymer rubbers such as EPR, EPDM, SEBS, etc.; dienic rubbers such as nitrile rubber, polybutadiene rubber, etc., acrylic rubbers, silicone rubbers, modified silicone oils, etc. Apart from the elastomer (D), the resin composition may also contain a thermoplastic resin such as polyethylene or the like that serves as a stress-relieving agent. Though not specifically defined, the amount of the elastomer and the like that may be in the resin composition of the invention generally falls between 0.05 and 20% by weight, but preferably between 0.1 and 10% by weight, more preferably between 0.2 and 5% by weight.

The resin composition of the invention may also contain a curing catalyst capable of promoting the curing reaction between the epoxy resin (A) and the curing agent (B). The curing catalyst is not specifically defined, so far as it promotes the curing reaction. For example, it includes imidazole compounds such as 2-methylimidazole, 2,4-dimethylimidazole, 2-methyl-4-methylimidazole, 2-heptadecylimidazole, etc.; tertiary amine compounds such as triethylamine, benzyldimethylamine, α-methylbenzyldimethylamine, 2-(dimethylaminomethyl) phenol, 2,4,6-tris(dimethylaminomethyl)phenol, 1,8-diazabicyclo(5,4,0)undecene-7, 1,5-diazabicyclo(4,3,0) nonene-5, etc.; organic metal compounds such as zirconium tetramethoxide, zirconium tetrapropoxide, tetrakis (acetylacetonato)zirconium, tri(acetylacetonato)aluminum, etc.; organic phosphine compounds such as triphenylphosphine, trimethylphosphine, triethylphosphine, tributylphosphine, tri(p-methylphenyl)phosphine, tri (nonylphenyl)phosphine, triphenylphosphine-triphenylborane, tetraphenylphosphonium tetraphenylborate, etc. Of those, preferred are triphenylphosphine, tetraphenylphosphonium, tetraphenylborate, and 1,8-diazabicyclo(5,4,0)undecene-7, in view of their reactivity. Depending on the use of the resin composition, two or more of those curing catalysts may be combined in the resin composition. The amount of the catalyst in the composition is preferably 0.01 to 10 parts by weight relative to 100 parts by weight of the epoxy resin (A) therein.

The resin composition of the invention may also contain a coupling agent of, for example, a silane coupling agent, titanate coupling agent or the like. It is desirable to previously treat the surface of the filler in the composition with the coupling agent, in view of the reliability of the composition. Preferably, the silane coupling agent for use herein has an alkoxy group and "a hydrocarbon group with a functional group of, for example, epoxy group, amino group, mercapto group or the like bonding thereto" both bonding to the silicon atoms constituting it.

The epoxy resin composition of the invention may optionally contain a halogen compound such as halogenoepoxy resins, etc.; a flame retardant such as phosphorus compounds, etc.; a flame retardation promoter such as antimony trioxide, etc.; a colorant such as carbon black, iron oxide, etc.; a mold lubricant such as long-chain fatty acids, metal salts of long-chain fatty acids, esters of long-chain fatty acids, amides of long-chain fatty acids, paraffin wax, etc.; and a crosslinking agent such as organic peroxides, etc.

The resin composition of the invention may have a viscosity of 0.1 to 1500 Pa·S, but preferably 0.5 to 40 Pa·S, more preferably 1 to 10 Pa·S at a temperature at which the composition is sealed on a chip wafer in the step of sealing semiconductor chips with it. The range of the viscosity of the composition is preferred so as to efficiently and uniformly form a good seal with no defect of the resin on the entire surface of a chip wafer.

The resin composition of the invention is applied onto a wafer having semiconductor chips thereon, thereby sealing the entire surface of the chip wafer. The method of sealing a chip wafer is not specifically defined. Employable methods include potting, spin coating, screen printing, transfer molding or the like. The most preferred sealing method is transfer molding in view of the easiness in forming the resin seal and the reliability of the seal.

Sealing a chip wafer with the resin composition of the invention is preferably effected under a pressure of at least 0.5 MPa, more preferably 0.5 to 30 MPa so as to increase the adhesiveness between the resin seal and the chip wafer. The adhesiveness between the chip wafer and the resin seal thereon under a pressure of at least 0.5 MPa is increased, and, as a result, the seal is hardly peeled away from the chip wafer and the reliability of the semiconductor chip is increased. In addition, the production costs are easy to lower. When the pressure for sealing is lower than 30 MPa, enriching the ability of the shaping machine is unnecessary and the production costs may be kept low.

Any apparatus may be used for forming the resin seal under pressure. Preferred apparatuses are conventional molding machines such as transfer molding machines.

The invention is described concretely with reference to the following Examples and Comparative Examples, in which % are by weight.

EXAMPLES 1 to 32, COMPARATIVE EXAMPLES 1 to 9

Production of Resin Compositions

The following filler, epoxy resin, curing agent, elastomer and other additives were formulated in a ratio as indicated in Table 1–4, and blended in dry. The resulting mixture was melted and kneaded in a double-screw extruder at a resin temperature of 90° C. After having been thus kneaded, this was cooled and ground to obtain a resin composition. Epoxy Resin (A):

A-1:

epoxy equivalent: 193

A-2:

epoxy equivalent: 283
n = 0–1

A-3:

epoxy equivalent: 176

A-4:

epoxy equivalent: 190

A-5:

epoxy equivalent: 150

Curing Agent (B):

B-1: phenol-novolak resin having a hydroxyl equivalent of 105.

B-2: phenol-aralkyl resin of the following formula, having a hydroxyl equivalent of 175:

(In the formula, n is 2 on numeral average.)

B-3: trishydroxyphenylmethane having a hydroxyl equivalent of 97.

B-4: terpene skeleton-having polyphenol of the following formula, having a hydroxyl equivalent of 175:

B-5: terpene-diphenol resin of the following formula, having a hydroxyl equivalent of 175:

Filler (C): spherical fused silica having a mean grain size of 12 μm.

Elastomer (D):

D-1: Clayton G1652 (SEBS) (from Shell Chemical).

D-2: Flowbeads HE-5023 (polyethylene, from Sumitomo Seika).

Curing Promoter: triphenylphosphine.

Colorant: carbon black.

Silane Coupling Agent: N-phenyl-γ-aminopropyltrimethoxysilane.

Measurement of Melt Viscosity

Using a vertical flow tester, the melt viscosity of each resin composition was measured at 180° C.

Measurement of Linear Expansion Coefficient

Using a transfer molding machine, each resin composition was molded at a molding temperature of 180° C. for a molding period of 3 minutes under a transfer pressure of 3 MPa, and then post-cured at 180° C. for 5 hours to prepare test pieces.

The dimension change relative to the temperature increase in each test piece was determined through TMA (thermal mechanical analysis). The inflection point in the dimension change indicates the glass transition point of the sample tested. The linear expansion coefficient of the sample at a temperature equal to or lower than the glass transition point is represented by α1; and that at a temperature equal to or higher than it is represented by α2.

Comparative Examples 1 to 4 were subjected to 500 cycles, and those of Examples 9 to 32 and Comparative Examples 5 to 9 were subjected to 1000 cycles. After the test, each sample was checked with the naked eye and with an optical microscope. The samples in which the resin seal peeled from the semiconductor chip were judged NG (not good).

The test data are shown in Tables 1 to 4.

TABLE 1

| | | Example 1 | Example 2 | Example 3 | Example 4 | Example 5 | Example 6 | Example 7 | Example 8 |
|---|---|---|---|---|---|---|---|---|---|
| Formulation of Composition, % | Filler | 49.5 | 49.5 | 69.5 | 79.5 | 49.5 | 49.5 | 49.5 | 49.5 |
| | Epoxy Resin | A-1 | A-1 | A-1 | A-1 | A-1 | A-1 | A-1 | A-1 |
| | | 33.10 | 33.10 | 19.78 | 13.12 | 33.10 | 33.10 | 33.10 | 33.10 |
| | Curing Agent | B-1 | B-1 | B-1 | B-1 | B-1 | B-1 | B-1 | B-1 |
| | | 16.20 | 16.20 | 9.68 | 6.43 | 16.20 | 16.20 | 16.20 | 16.20 |
| | Curing Promoter | 0.40 | 0.40 | 0.24 | 0.15 | 0.40 | 0.40 | 0.40 | 0.40 |
| | Colorant | 0.30 | 0.30 | 0.30 | 0.30 | 0.30 | 0.30 | 0.30 | 0.30 |
| | Silane Coupling Agent | 0.50 | 0.50 | 0.50 | 0.50 | 0.50 | 0.50 | 0.50 | 0.50 |
| Linear Expansion Coefficient | | | | | | | | | |
| α1, $10^{-6}$/K | | 52 | 52 | 25 | 19 | 52 | 52 | 52 | 52 |
| α2, $10^{-6}$/K | | 136 | 136 | 82 | 62 | 136 | 136 | 136 | 136 |
| Melt Viscosity, Pa · S | | 2 | 2 | 10 | 12 | 2 | 2 | 2 | 2 |
| Molding Pressure, MPa | | 0.5 | 3 | 3 | 3 | 3 | 3 | 10 | 3 |
| Film Thickness, μm (set point) | | 100 | 100 | 100 | 100 | 30 | 50 | 100 | 200 |
| Percentage of Failed Films, % | | 0 | 0 | 0 | 0 | 3 | 3 | 1 | 0 |
| Wafer Warpage, mm | | 2.0 | 1.8 | 1.2 | 1.0 | 1.8 | 1.3 | 1.5 | 2.9 |
| Temperature Cycle Test, 500 cycles, number of NG samples/number of all samples tested | | 3/10 | 2/10 | 1/10 | 0/10 | 3/10 | 2/10 | 1/10 | 1/10 |

Measurement of Flexural Modulus

Bending test pieces were prepared under the same condition as that for the measurement of linear expansion coefficient, and subjected to a three-point bending test at 23° C. From the load-deflection curve in the test, calculated was the flexural modulus of the sample tested.

Sealing of Resin Composition on Chip Wafer

Figure 2:
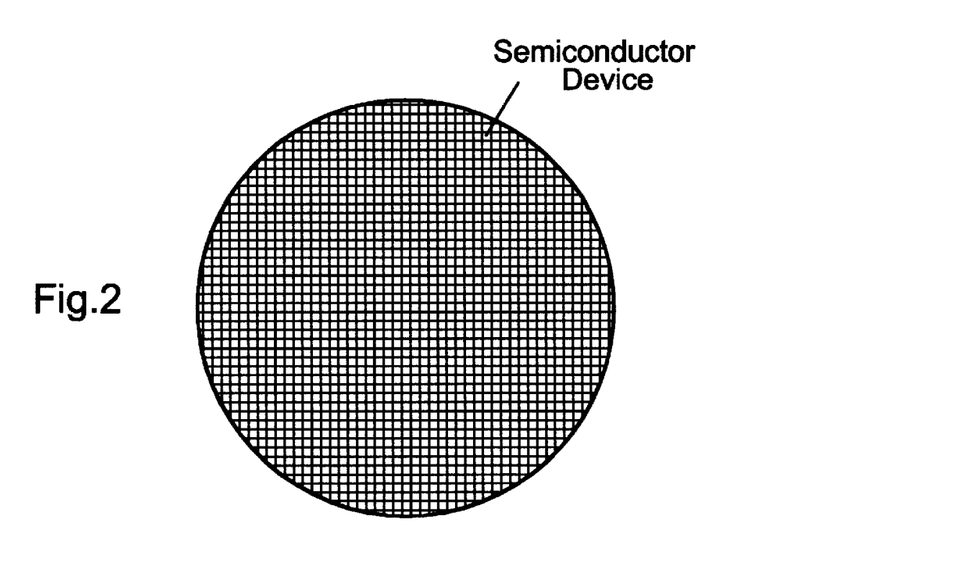
FIG. 2 is a plan view showing one embodiment of a wafer for the semiconductor device of the invention.

Using a transfer molding machine, a film of a sealed resin composition was formed on a 6-inch wafer as in FIG. 2, at a temperature of 180° C., for which the molding pressure was varied as in Table 1–4 and the time under the pressure was 3 minutes. The resin-sealed wafer was then post-cured at 180° C. for 5 hours, and its properties were measured and evaluated.

Using a contact surface roughness meter and a micrometer, the thickness of the film of a sealed resin composition as formed on each wafer was measured. Five wafers were tested for one resin composition sample, and the film thickness was measured at 40 points in each wafer.

The percentage of failed films indicates the percentage of seals of which the thickness overstepped +/−20% of the set point.

Measurement of Wafer Warpage

Using a contact surface roughness meter, the degree of warpage of each wafer sealed with a resin composition was measured.

Figure 1:
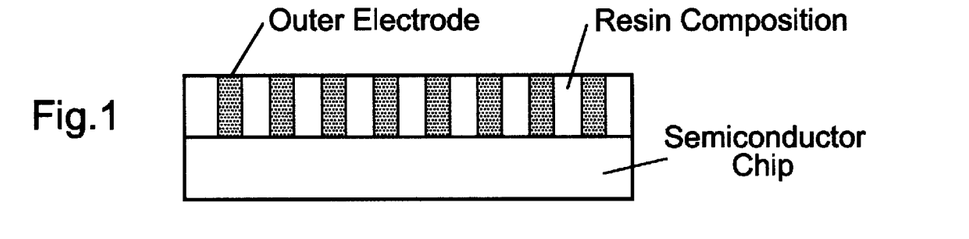
FIG. 1 is a vertical cross-sectional view showing one embodiment of the semiconductor device of the invention.

The wafer sealed with resin composition was cut into individual semiconductor chips (10×10 mm), as in FIG. 1, and each chip was subjected top a temperature cycle test of from −65° C. to 150° C. The samples of Examples 1 to 8 and

TABLE 2

| | | Comp. Example 1 | Comp. Example 2 | Comp. Example 3 | Comp. Example 4 |
|---|---|---|---|---|---|
| Formulation of Composition, % | Filler | 27.5 | 39.5 | 49.5 | 49.5 |
| | Epoxy Resin | A-1 | A-1 | A-1 | A-1 |
| | | 46.40 | 39.70 | 33.10 | 33.10 |
| | Curing Agent | B-1 | B-1 | B-1 | B-1 |
| | | 22.70 | 19.50 | 16.20 | 16.20 |
| | Curing Promoter | 0.60 | 0.50 | 0.40 | 0.40 |
| | Colorant | 0.30 | 0.30 | 0.30 | 0.30 |
| | Silane Coupling Agent | 0.50 | 0.50 | 0.50 | 0.50 |
| Linear Expansion Coefficient | | | | | |
| α1, $10^{-6}$/K | | 71 | 65 | 52 | 52 |
| α2, $10^{-6}$/K | | 175 | 152 | 136 | 136 |
| Melt Viscosity, Pa · S | | 1 | 1.5 | 2 | 2 |
| Molding Pressure, MPa | | 3 | 3 | 0.3 | 3 |
| Film Thickness, μm (set point) | | 100 | 100 | 100 | 20 |
| Percentage of Failed Films, % | | 0 | 0 | 0 | 60 |
| Wafer Warpage, mm | | 7.5 | 5.5 | 4.9 | 0.5 |
| Temperature Cycle Test, 500 cycles, number of NG samples/number of all samples tested | | 10/10 | 10/10 | 10/10 | 1/10 |

TABLE 3

|  |  | Ex. 9 | Ex. 10 | Ex. 11 | Ex. 12 | Ex. 13 | Ex. 14 | Ex. 15 | Ex. 16 | Ex. 17 | Ex. 18 |
|---|---|---|---|---|---|---|---|---|---|---|---|
| Formulation of Composition, % | Filler | 90 | 80 | 50 | 70 | 80 | 85 | 70 | 85 | 50 | 60 |
|  | Epoxy Resin | A-5 | A-5 | A-1 | A-1 | A-1 | A-1 | A-1 | A-1 | A-2 | A-2 |
|  |  | 4.7 | 10.9 | 24 | 19.5 | 10 | 7.4 | 15.3 | 8.0 | 31 | 29 |
|  | Curing Agent | B-3 | B-3 | B-2 | B-3 | B-4 | B-5 | B-2  B-5 | B-5  B-4 | B-2 | B-3 |
|  |  | 2.1 | 6.3 | 19.9 | 9.6 | 9.1 | 6.7 | 6.9  6.9 | 3.5  3.6 | 17.8 | 9.9 |
|  | Elastomer | D-1 | D-1 | D-2 | — | — | — | — | — | — | — |
|  |  | 1.5 | 2.0 | 5.0 |  |  |  |  |  |  |  |
|  | Curing Promoter | 0.1 | 0.1 | 0.3 | 0.2 | 0.2 | 0.2 | 0.2 | 0.2 | 0.4 | 0.3 |
|  | Colorant | 0.1 | 0.2 | 0.3 | 0.2 | 0.2 | 0.2 | 0.2 | 0.2 | 0.3 | 0.3 |
|  | Silane Coupling Agent | 0.5 | 0.5 | 0.5 | 0.5 | 0.5 | 0.5 | 0.5 | 0.5 | 0.5 | 0.5 |
| Linear Expansion Coefficient |  |  |  |  |  |  |  |  |  |  |  |
| $\alpha 1$, $10^{-6}$/K |  | 7 | 13 | 41 | 20 | 13 | 10 | 19 | 11 | 48 | 41 |
| $\alpha 2$, $10^{-6}$/K |  | 25 | 42 | 100 | 65 | 55 | 35 | 61 | 38 | 125 | 115 |
| Flexural Modulus, GPa |  | 28 | 19 | 4 | 14 | 20 | 25 | 14 | 25 | 5 | 6 |
| $\alpha 1 \times$ Flexural Modulus, $\times 10^{-5}$ GPa/K |  | 19.6 | 24.7 | 16.4 | 28 | 26 | 25 | 26.6 | 27.5 | 24.0 | 24.6 |
| Melt Viscosity, Pa·S |  | 65 | 22 | 10 | 12 | 20 | 25 | 15 | 19 | 2 | 3 |
| Molding Pressure, MPa |  | 3 | 3 | 3 | 3 | 3 | 3 | 3 | 3 | 3 | 3 |
| Film Thickness, µm (set point) |  | 150 | 100 | 100 | 100 | 100 | 100 | 100 | 100 | 100 | 100 |
| Percentage of Failed Films, % |  | 5.5 | 1.0 | 0 | 0 | 0.5 | 1.0 | 0 | 0 | 0 | 0 |
| Wafer Warpage, mm |  | 1.0 | 0.9 | 0.5 | 1.2 | 0.9 | 0.7 | 1.2 | 0.8 | 1.0 | 0.9 |
| Temperature Cycle Test, 1000 cycles, number of NG samples/number of all samples tested |  | 0/10 | 0/10 | 0/10 | 0/10 | 0/10 | 0/10 | 0/10 | 0/10 | 0/10 | 0/10 |

|  |  | Ex. 19 | Ex. 20 | Ex. 21 | Ex. 22 | Ex. 23 | Ex. 24 | Ex. 25 | Ex. 26 |
|---|---|---|---|---|---|---|---|---|---|
| Formulation of Composition, % | Filler | 70 | 70 | 75 | 80 | 75 | 75 | 65 | 70 |
|  | Epoxy Resin | A-2 | A-2 | A-2 | A-2 | A-2 | A-2 | A-3 | A-3 |
|  |  | 18 | 18 | 14 | 12 | 18.1 | 13.0 | 17 | 16 |
|  | Curing Agent | B-4  B-5 | B-2  B-4 | B-3  B-5 | B-2  B-4 | B-2  B-5 | B-2  B-4 | B-3  B-5 | B-3  B-5 |
|  |  | 10.9  10.9 | 7  3 | 3  4.1 | 7  3 | 6  4.1 | 10  6.9 | 5  8 |  |
|  | Elastomer | — | — | — | — | D-1 | D-2 | — | — |
|  |  |  |  |  |  | 1.0 | 1.0 |  |  |
|  | Curing Promoter | 0.3 | 0.3 | 0.3 | 0.2 | 0.2 | 0.2 | 0.3 | 0.3 |
|  | Colorant | 0.3 | 0.3 | 0.2 | 0.2 | 0.2 | 0.2 | 0.3 | 0.2 |
|  | Silane Coupling Agent | 0.5 | 0.5 | 0.5 | 0.5 | 0.5 | 0.5 | 0.5 | 0.5 |
| Linear Expansion Coefficient |  |  |  |  |  |  |  |  |  |
| $\alpha 1$, $10^{-6}$/K |  | 21 | 19 | 15 | 12 | 22 | 18 | 26 | 20 |
| $\alpha 2$, $10^{-6}$/K |  | 70 | 65 | 55 | 40 | 70 | 60 | 75 | 65 |
| Flexural Modulus, GPa |  | 11 | 2 | 18 | 21 | 9 | 11 | 11 | 13 |
| $\alpha 1 \times$ Flexural Modulus, $\times 10^{-5}$ GPa/K |  | 23.1 | 22.8 | 27 | 25.2 | 19.8 | 19.8 | 28.6 | 26 |
| Melt Viscosity, Pa·S |  | 10 | 10 | 19 | 22 | 20 | 23 | 7 | 15 |
| Molding Pressure, MPa |  | 3 | 3 | 3 | 3 | 3 | 3 | 3 | 3 |
| Film Thickness, µm (set point) |  | 100 | 100 | 100 | 100 | 100 | 100 | 100 | 100 |
| Percentage of Failed Films, % |  | 0 | 0 | 0 | 0 | 0 | 0 | 0 | 0 |
| Wafer Warpage, mm |  | 0.9 | 1.1 | 0.7 | 0.6 | 0.9 | 0.7 | 1.2 | 1.1 |
| Temperature Cycle Test, 1000 cycles, number of NG samples/number of all samples tested |  | 0/10 | 0/10 | 0/10 | 0/10 | 0/10 | 0/10 | 1/10 | 0/10 |

|  |  | Ex. 27 | Ex. 28 | Ex. 29 | Ex. 30 | Ex. 31 | Ex. 32 |
|---|---|---|---|---|---|---|---|
| Formulation of Composition, % | Filler | 70 | 70 | 75 | 70 | 70 | 70 |
|  | Epoxy Resin | A-3 | A-4 | A-4 | A-4 | A-4 | A-4 |
|  |  | 15 | 16 | 13 | 15 | 16 | 15 |
|  | Curing Agent | B-3  B-5 | B-2 | B-4 | B-5 | B-3  B-5 | B-3  B-5 |
|  |  | 5  7 | 13 | 11.1 | 14.1 | 5  8.1 | 5  7.1 |
|  | Elastomer | D-2 | — | — | — | — | D-1 |
|  |  | 2.0 |  |  |  |  | 2.0 |
|  | Curing Promoter | 0.3 | 0.3 | 0.2 | 0.2 | 0.2 | 0.2 |
|  | Colorant | 0.2 | 0.2 | 0.2 | 0.2 | 0.2 | 0.2 |
|  | Silane Coupling Agent | 0.5 | 0.5 | 0.5 | 0.5 | 0.5 | 0.5 |
| Linear Expansion Coefficient |  |  |  |  |  |  |  |
| $\alpha 1$, $10^{-6}$/K |  | 19 | 18 | 15 | 20 | 21 | 21 |
| $\alpha 2$, $10^{-6}$/K |  | 65 | 65 | 50 | 63 | 65 | 68 |
| Flexural Modulus, GPa |  | 10 | 14 | 18 | 14 | 13 | 11 |
| $\alpha 1 \times$ Flexural Modulus, $\times 10^{-5}$ GPa/K |  | 19 | 25.2 | 27 | 28 | 27.3 | 23.1 |
| Melt Viscosity, Pa·S |  | 25 | 14 | 20 | 18 | 19 | 25 |
| Molding Pressure, MPa |  | 3 | 3 | 3 | 3 | 3 | 3 |
| Film Thickness, µm (set point) |  | 100 | 100 | 100 | 100 | 100 | 100 |
| Percentage of Failed Films, % |  | 0 | 0 | 0.5 | 0 | 0 | 0 |
| Wafer Warpage, mm |  | 0.8 | 1.0 | 0.8 | 0.9 | 1.0 | 0.7 |

TABLE 3-continued

|  |  |  |  |  |  |  |
|---|---|---|---|---|---|---|
| Temperature Cycle Test, 1000 cycles, number of NG samples/number of all samples tested | 0/10 | 0/10 | 0/10 | 0/10 | 0/10 | 0/10 |

TABLE 4

| | | Comp. Ex. 5 | Comp. Ex. 6 | Comp. Ex. 7 | Comp. Ex. 8 | Comp. Ex. 9 |
|---|---|---|---|---|---|---|
| Formulation of Composition, % | Filler | 90 | 80 | 50 | 90 | 70 |
| | Epoxy Resin | A-5 | A-5 | A-1 | A-5 | A-4 |
| | | 5.6 | 12.1 | 26.0 | 3.0 | 15.0 |
| | Curing Agent | B-3 | B-3 | B-3 | B-3 | B-5 |
| | | 3.7 | 7.1 | 22.9 | 1.3 | 14.1 |
| | Elastomer | — | — | — | D-1 | — |
| | | | | | 5.0 | |
| | Curing Promoter | 0.1 | 0.1 | 0.3 | 0.1 | 0.2 |
| | Colorant | 0.1 | 0.2 | 0.3 | 0.1 | 0.2 |
| | Silane Coupling Agent | 0.5 | 0.5 | 0.5 | 0.5 | 0.5 |
| Linear Expansion Coefficient | | | | | | |
| $\alpha 1$, $10^{-6}$/K | | 6 | 13 | 40 | 8 | 20 |
| $\alpha 2$, $10^{-6}$/K | | 25 | 40 | 115 | 29 | 63 |
| Flexural Modulus, GPa | | 33 | 25 | 9 | 10 | 14 |
| $\alpha 1$ × Flexural Modulus, $\times 10^{-5}$ GPa/K | | 19.8 | 32.5 | 36 | 8 | 28 |
| Melt Viscosity, Pa·S | | 50 | 15 | 7 | 600 | 18 |
| Molding Pressure, MPa | | 3 | 3 | 3 | 3 | 0.2 |
| Film Thickness, μm (set point) | | 150 | 100 | 100 | 150 | 100 |
| Percentage of Failed Films, % | | 4.0 | 0.5 | 0 | 100 | 100 |
| Wafer Warpage, mm | | 3.3 | 2.9 | 3.3 | 4.0 | 2.3 |
| Temperature Cycle Test, 1000 cycles, number of NG samples/number of all samples tested | | 6/10 | 9/10 | 10/10 | 9/10 | 10/10 |

As seen in Table 1 and Table 3, the resin composition samples of the invention as used in fabricating semiconductor devices formed good seals on wafers. With these, the percentage of failed seals was low and the sealed wafers warped little. In addition, the semiconductor devices all had good temperature cycle resistance. Specifically, it is understood that, when the resin composition and the semiconductor device of the invention are used, highlyreliable chip-size packages with good temperature cycle resistance are fabricated efficiently at low costs.

From the data in Examples 1 to 8, it can be seen that the sealed wafers warped little and had good temperature cycle resistance when the resin compositions used had a linear expansion coefficient, $\alpha 1$ of $60 \times 10^{-6}$/K and $\alpha 2$ of $140 \times 10^{-6}$/K or less. On the other hand, the wafers sealed with the resin composition of which the linear expansion coefficient was larger than those values (wafers of Comparative Examples 1 and 2) warped much and their temperature cycle resistance was not good.

From the data in Examples 9 to 32, it can be seen that the sealed wafers warped little and had better temperature cycle resistance when the flexural modulus of the resin compositions used was not larger than 30 GPa and when the product of ($\alpha 1 \times$ flexural modulus) of the compositions fell between 5 and $30 \times 10^{-5}$ GPa/K.

As in Table 4, when the flexural modulus of the resin compositions used was larger than 30 GPa (samples of Comparative Examples) or when the product of ($\alpha 1 \times$ flexural modulus) of the compositions was larger than $30 \times 10^{-6}$ GPa/K even though the flexural modulus thereof was not larger than 30 GPa (samples of Comparative Examples 6 and 7), the sealed wafers warped much and their temperature cycle resistance was poor.

It is understood that, even if $\alpha 1$, $\alpha 2$, the flexural modulus, and the product of ($\alpha 1 \times$ flexural modulus) of the resin composition were all within the ranges defined herein but when the melt viscosity thereof was larger than 50 Pa·S (samples of Comparative Example 8), then the percentage of failed seals was large, the sealed wafers warped much and their temperature cycle resistance was poor.

It is also understood that, even if the formulation of the resin composition fell within the range defined herein but when the molding pressure applied thereto was lower than 0.5 MPa (samples of Comparative Example 9), then the percentage of failed films was large, the sealed wafers warped much and their temperature cycle resistance was poor.

As described above, the sealed semiconductor chip of the invention has high reliability and is especially favorable to chip-size semiconductor packages. In addition, the semiconductor-sealing resin composition of the invention forms a good seal on chip wafers, and the wafers sealed with the resin composition warp little. Therefore, the resin composition has high reliability and is extremely useful.

What is claimed is:

1. A sealed semiconductor chip comprising a semiconductor chip having a surface film comprising a cured, sealed resin composition, said surface film having a thickness in the range of 30 to 2000 μm, wherein said cured resin composition comprises an epoxy, silicone, or polyimide resin and has a linear expansion coefficient of $60 \times 10^{-6}$/K or less at a temperature equal to or less than its glass transition point and $140 \times 10^{-6}$/K or less at a temperature equal to or higher than its glass transition point.

2. The sealed semiconductor chip as claimed in claim 1, wherein said sealed semiconductor chip is fabricated by sealing a semiconductor chip provided on a wafer with said cured resin composition followed by cutting the resin-sealed wafer into individual semiconductor chips.

3. The sealed semiconductor chip as claimed in claim 1 or 2, wherein the thickness of the cured resin composition seal is 30 to 300 μm.

4. The sealed semiconductor chip as claimed in claim 1 or 2, wherein the thickness of the cured resin composition seal is 30 to 150 μm.

5. A semiconductor-sealing resin composition for sealing a semiconductor chip wherein said resin composition comprises an epoxy resin, silicone resin, or a polyimide resin, wherein said resin composition is cured, wherein said resin composition has a linear expansion coefficient of $60 \times 10^{-6}$/K or less at a temperature equal to or less than its glass transition point and $140 \times 10^{-6}$/K or less at a temperature equal to or higher than its glass transition point, and wherein said resin composition has a flexural modulus of 1 GPa to 30 GPa at 23° C.

6. The semiconductor-sealing resin composition as claimed in claim 5, wherein the product of (linear expansion coefficient at a temperature equal to or less than the glass transition point)×(flexural modulus at 23° C.) is $5×10^{-5}$ GPa/K to $30×10^{-5}$ GPa/K.

7. The semiconductor-sealing resin composition as claimed in claim 5, wherein said sealed semiconductor chip is fabricated by forming a seal of the resin composition on a semiconductor chip provided on a wafer followed by cutting the resin-sealed wafer into individual semiconductor chips.

8. The semiconductor-sealing resin composition as claimed in claim 5, wherein said sealed semiconductor chip is fabricated by forming a seal of the resin composition on a semiconductor chip wafer having outer electrodes formed thereon, followed by cutting the resin-sealed wafer into individual semiconductor chips.

9. The semiconductor-sealing resin composition as claimed in claim 5, comprising (A) an epoxy resin, (B) a curing agent and (C) a filler, wherein the amount of the epoxy resin (A) is 0.5 to 80% by weight, the content of the curing agent (B) is 0.5 to 80% by weight and the amount of the filler (C) is 35 to 98% by weight.

10. The semiconductor-sealing resin composition as claimed in claim 5, comprising (A) an epoxy resin, (B) a curing agent and (C) a filler, wherein the amount of the epoxy resin (A) is 1 to 50% by weight, the amount of the curing agent (B) is 1 to 50% by weight and the amount of the filler (C) is 40 to 95% by weight.

11. The semiconductor-sealing resin composition as claimed in claim 5, comprising (A) an epoxy resin, (B) a curing agent and (C) a filler, wherein the amount of the epoxy resin (A) is 2 to 30% by weight, the amount of the curing agent (B) is 2 to 30% by weight and the amount of the filler (C) is 45 to 95% by weight.

12. The semiconductor-sealing resin composition as claimed in claim 9, wherein the epoxy resin (A) contains at least one biphenyl-type epoxy resin.

13. The semiconductor-sealing resin composition as claimed in claim 9, wherein the epoxy resin (A) contains at least one dicyclopentadiene-type epoxy resin.

14. The semiconductor-sealing resin composition as claimed in claim 9, wherein the epoxy resin (A) contains at least one polyfunctional epoxy resin as produced from polyfunctional phenols.

15. The semiconductor-sealing resin composition as claimed in claim 9, wherein the epoxy resin (A) contains at least one naphthalene-type epoxy resin.

16. The semiconductor-sealing resin composition as claimed in claim 9, wherein the curing agent (B) contains at least one phenolic resin having at least two phenolic hydroxyl groups in the molecule.

17. The semiconductor-sealing resin composition as claimed in claim 9, wherein the curing agent (B) contains at least one phenol-novolak resin.

18. The semiconductor-sealing resin composition as claimed in claim 9, wherein the curing agent (B) contains at least one phenol-aralkyl resin.

19. The semiconductor-sealing resin composition as claimed in claim 9, wherein the curing agent (B) contains at least one terpene-phenolic resin.

20. The semiconductor-sealing resin composition as claimed in claim 9, wherein the curing agent (B) contains at least one polyfunctional phenolic resin.

21. The semiconductor-sealing resin composition as claimed in claim 9, wherein the curing agent (B) contains a terpene-phenolic resin and a phenol-aralkyl resin.

22. The semiconductor-sealing resin composition as claimed in claim 9, wherein the curing agent (B) contains at least one terpene-phenolic resin and at least one polyfunctional phenolic resin.

23. The semiconductor-sealing resin composition as claimed in claim 5, wherein said resin composition contains at least one elastomer (D).

24. The semiconductor-sealing resin composition as claimed in claim 5, wherein said resin composition is formed into a seal on a surface of a semiconductor chip through transfer molding.

25. The semiconductor-sealing resin composition as claimed in claim 5, wherein said resin composition has a viscosity at a temperature at which it is sealed on a surface of a semiconductor chip of 0.1 to 1500 Pa·S.

26. The semiconductor-sealing resin composition as claimed in claim 5, wherein said resin composition has a viscosity at a temperature at which it is sealed on a surface of a semiconductor chip of 0.5 to 40 Pa·S.

27. The semiconductor-sealing resin composition as claimed in claim 5, wherein said resin composition has a viscosity at a temperature at which it is sealed on a surface of a semiconductor chip of 1 to 10 Pa·S.

28. The semiconductor-sealing resin composition as claimed in claim 5, wherein said resin composition is sealed onto a surface of a semiconductor chip under a pressure of 0.5 to 30 MPa.

29. The semiconductor-sealing resin composition as claimed in claim 5, wherein said resin composition is formed into a seal having a thickness of 30 to 2000 μm.

30. The semiconductor-sealing resin composition as claimed in claim 5, wherein said resin composition is formed into a seal having a thickness of 30 to 300 μm.

31. The semiconductor-sealing resin composition as claimed in claim 5, wherein said resin composition is formed into a seal having a thickness of 30 to 150 μm.

32. A sealed semiconductor chip as claimed in claim 1, wherein said semiconductor chip has outer electrodes and said resin composition extends between said outer electrodes.

* * * * *

UNITED STATES PATENT AND TRADEMARK OFFICE
CERTIFICATE OF CORRECTION

PATENT NO. : 6,361,879 B1
DATED : March 26, 2002
INVENTOR(S) : Tsutsumi et al.

It is certified that error appears in the above-identified patent and that said Letters Patent is hereby corrected as shown below:

Column 11,
Table 3, Example 20, at "Flexural Modulus, GPa", please change "2" to -- 12 --.

Signed and Sealed this

Third Day of September, 2002

Attest:

JAMES E. ROGAN
Attesting Officer        Director of the United States Patent and Trademark Office